(12) United States Patent
Minzoni

(10) Patent No.: US 7,292,080 B2
(45) Date of Patent: Nov. 6, 2007

(54) DELAY LOCKED LOOP USING A FIFO CIRCUIT TO SYNCHRONIZE BETWEEN BLENDER AND COARSE DELAY CONTROL SIGNALS

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 11/211,825

(22) Filed: Aug. 25, 2005

(65) Prior Publication Data

US 2007/0046344 A1 Mar. 1, 2007

(51) Int. Cl.
*H03L 7/06* (2006.01)
(52) U.S. Cl. ...................................... 327/158; 327/161
(58) Field of Classification Search ...................... None
See application file for complete search history.

(56) References Cited

U.S. PATENT DOCUMENTS 5,604,775 A * 2/1997 Saitoh et al. ............... 375/376
6,727,738 B2 * 4/2004 Tsukikawa .................. 327/160
6,836,166 B2 * 12/2004 Lin et al. .................... 327/158

* cited by examiner

*Primary Examiner*—Kenneth B. Wells
*Assistant Examiner*—An T. Luu
(74) *Attorney, Agent, or Firm*—Patterson & Sheridan, L.L.P.

(57) ABSTRACT

Embodiments of the present invention generally provide improved techniques and circuit configurations for a delay-locked loop (DLL) circuit. In one embodiment, a first phase difference between an input clock signal and an output clock signal is measured. Based on the first phase difference, a first phase adjustment setting is stored in a first FIFO and a second phase adjustment setting is stored in a second FIFO. The first phase adjustment setting is applied to adjust a phase of the input clock signal and the adjusted clock signal passes through one or more delay elements. The second phase adjustment setting is applied to further adjust the delayed input clock signal. As a result, the first phase adjustment setting and the second phase adjustment setting are applied correctly with respect to an edge of the clock signal passing through the DLL circuit.

21 Claims, 5 Drawing Sheets

DELAY LOCKED LOOP USING A FIFO CIRCUIT TO SYNCHRONIZE BETWEEN BLENDER AND COARSE DELAY CONTROL SIGNALS

BACKGROUND OF THE INVENTION

1. Field of the Invention

The present invention generally relates to integrated circuit devices and, more particularly to delay locked loops utilized in integrated circuit devices.

2. Description of the Related Art

Delay locked loops (DLL) are utilized in a wide variety of integrated circuit (IC) devices to synchronize output signals with periodic input signals. In other words, the objective of the DLL is to adjust a phase difference between the input and output signals near zero, for example, to align rising or falling edges of the input and output signals.

FIG. 1 illustrates an exemplary dynamic random access memory (DRAM) device 200 utilizing a delay locked loop (DLL) circuit 100. A typical requirement of DRAM specifications is that data from memory arrays 204 be available on output lines DQ[0:N] in conjunction with the rising edge (and falling edge in double data rate devices) of an externally supplied clock signal (EXT CLK). In some cases, the DRAM 200 may supply a data strobe signal DQS controlled, for example by DQS generator 206. Typically, the DQS signal should also be synchronized with EXT CLK, thus indicating the data is available.

The DLL circuit 100 may be used to synchronize the DQS and DQ signals with the EXT CLK signal through the introduction of an artificial delay of EXT CLK. Thus, the DLL circuit 100 may be used to increase the valid output data window by synchronizing the output of data with both the rising and falling edges of an output clock $CLK_{OUT}$ applied to the driver circuits 208.

As illustrated, the DLL circuit 100 generally includes a phase blender circuit 102, a coarse adjust circuit 104, a counter 106, and a phase detector 108.

The EXT CLK may pass through one or more electrical connections and circuits before being received by the DLL circuit 100 as the $CLK_{IN}$ signal. The $CLK_{IN}$ signal may pass through the phase blender circuit 102 (also referred to as the fine adjust circuit). The output of the phase blender circuit ($CLK_{IN\_BLENDED}$) may then pass through the coarse adjust circuit 104 before being output as a $CLK_{OUT}$ signal. The $CLK_{OUT}$ signal may pass through one or more electrical connections and circuits before being externally output as a data strobe signal, DQS.

The phase detector 108 may be used to synchronize the externally received clock signal with DQS by comparing the $CLK_{IN}$ signal to a feedback clock signal $CLK_{FB}$ signal using feedback loop 112. The feedback clock signal $CLK_{FB}$ may be produced by a feedback delay 110 which may be inserted into the feedback loop 112 to mimic any delay between the externally used clock signals (EXT CLK and DQS) and the internal clock signals $CLK_{IN}$ and $CLK_{OUT}$ created by the electrical connections and circuits external to the DLL circuit 100. By mimicking delays in such external circuitry, EXT CLK and DQS may be more accurately synchronized.

To synchronize the $CLK_{IN}$ and $CLK_{FB}$ signals, the phase detector 108 may compare the phase of $CLK_{FB}$ to $CLK_{IN}$ and generate a signal to the counter 106. The counter 106 may output control signals which may be used to align the phases of $CLK_{IN}$ and $CLK_{FB}$. The counter 106 may adjust both of the control signals based on the phase difference detected by the phase detector 108.

The counter 106 may use adjustments to the control signal for the phase blender circuit 102 to make relatively small adjustments to the phase of $CLK_{OUT}$, and/or make adjustments to the output signal to the coarse adjust circuit 104 to make relatively large adjustments to the phase of $CLK_{OUT}$. The coarse adjust circuit 104 may contain several delay elements which may be selectively enabled (the combination of delay elements is referred to as a delay line). By varying the number of enabled delay elements, the coarse adjust circuit 104 may make large incremental adjustments to the phase of $CLK_{OUT}$. The combined adjustments of the coarse adjust circuit 104 and the phase blender circuit 102 may allow for large, accurate adjustments in the phase of the $CLK_{OUT}$ signal.

In some cases, the control signals output by the counter may be in the form of a count (e.g., 7.8). One signal from the counter 106 (e.g., the integer portion of the count, 7) may control the coarse adjust circuit 104 and another signal from the counter 106 (e.g., the decimal portion of the count, 0.8) may control the phase blender circuit 102. Each time the counter 106 issues new control signals for the phase blender circuit 102 and the coarse adjust circuit 104, the control signals may be latched by a blender latch 210 and a coarse adjust latch 212 in order to preserve the control signals for use by the phase blender circuit 102 and the coarse adjust circuit 104 for use with a current clock signal being processed. Each latch 210, 212 may only latch a single control signal.

As a given clock edge of $CLK_{IN}$ moves through the phase blender circuit 102 and the coarse adjust circuit 104, it may be delayed, for example, by the delay line in the coarse adjust circuit 104. In some cases, the delay line may delay the $CLK_{OUT}$ signal from the $CLK_{IN}$ signal by one or more multiples of their clock periods. In some cases, the delay caused by the delay line may cause errors in applying the fine adjust and coarse adjust settings.

For example, the $CLK_{IN}$ signal may be delayed over one clock cycle as it passes through the coarse adjust circuit 104. Because the $CLK_{IN}$ signal is delayed just over one clock cycle, each $CLK_{OUT}$ cycle may reflect the present coarse adjust setting but the previous phase blender setting. Thus, during a first clock cycle, the counter may adjust the count to 9.9 and during a second clock cycle the counter may adjust the count to 10.0. The adjustment may be made, for example, in response to a changing operating temperature and/or voltage or due to a change in the external signal EXT CLK.

As the $CLK_{IN}$ signal passes through the DLL circuit 100, the blender adjustment made to the signal may be 0.9 (from the blender setting during the first clock cycle), and due to the delay of over a cycle in the coarse adjust circuit 104, the coarse adjustment made to $CLK_{OUT}$ may be 10 (from the coarse adjust setting during the second clock cycle). Accordingly, the $CLK_{OUT}$ adjustment may be 10.9, a setting which differs from the desired adjustments of 9.9 during the first clock cycle and 10.0 during the second clock cycle. Similarly, if the counter control setting during a first clock cycle is 7.0 and the counter control setting during a second clock cycle is 6.9, the adjustment made to $CLK_{OUT}$ may be the undesired adjustment of 6.0.

To prevent such undesired adjustments, current methods of applying DLL control signals may employ delay elements arranged in different configurations. In some cases, those configurations may result in high complexity, large layout sizes, high power consumption, or frequency limits of a DLL circuit. Accordingly, there is a need for improved techniques and circuit configurations for synchronously applying control signals in a DLL circuit.

SUMMARY OF THE INVENTION

Embodiments of the present invention generally provide improved techniques and circuit configurations for a delay-locked loop (DLL) circuit. In one embodiment, a method for synchronizing control signals in a delay locked loop circuit is provided. The delay locked loop circuit has a coarse phase adjust circuit and a fine phase adjust circuit. The method includes measuring a first phase difference between an input clock signal and an output clock signal and, based on the first phase difference, storing a first phase adjustment setting in a first FIFO and storing a second phase adjustment setting in a second FIFO, wherein each FIFO stores a plurality of settings. The first phase adjustment setting is applied to adjust a phase of the input clock signal and the adjusted clock signal passes through one or more delay elements, delaying the adjusted input clock signal. The second phase adjustment setting is applied to further adjust the delayed input clock signal.

In another embodiment of the invention, a first phase difference between an input clock signal and an output clock signal is measured. Based on the first measured phase difference, one or more coarse adjust control settings is stored in a coarse adjust FIFO and one or more fine adjust control settings is stored in a fine adjust FIFO. Each FIFO stores a plurality of control settings and the input clock signal is used to clock an input of each FIFO. A setting from a first one of the FIFOs is output in conjunction with the input clock signal and a setting from a second one of the FIFOs is output in conjunction with a time-delayed version of the input clock signal. The setting output from the coarse adjust FIFO and the setting output from the fine adjust FIFO are applied to the coarse phase adjust circuit and the fine phase adjust circuit respectively. The one or more coarse adjust settings in the coarse adjust FIFO and the one or more fine adjust control settings in the fine adjust FIFO are applied to an edge of the input clock signal in the delay locked loop circuit passing through the coarse phase adjust circuit and the fine phase adjust circuit.

Another embodiment of the invention provides a delay locked loop circuit having a delay circuit, a coarse phase adjust circuit, a fine phase adjust circuit, a first FIFO circuit a second FIFO circuit, and circuitry. The delay circuit has one or more delay elements and provides a delay. The coarse phase adjust circuit is configured to make coarse phase adjustments to the phase of a clock signal based on a coarse phase adjustment setting. The fine phase adjust circuit is configured to make fine phase adjustments to the phase of a clock signal based on a fine phase adjustment setting. The first FIFO circuit and a second FIFO circuit each store a plurality of control signals. The circuitry measures a phase difference between an input clock signal and an output clock signal. Based on the first measured phase difference, a first coarse phase adjustment setting is stored in the first FIFO circuit and a first fine phase adjustment setting is stored in the second FIFO. One of the first coarse phase adjustment setting and the first fine phase adjustment setting is applied to the input clock signal and the other of the first coarse phase adjustment setting and the first fine phase adjustment setting is applied to a delayed clock signal. The delayed clock signal is the input clock signal delayed by the delay circuit.

Another embodiment of the invention provides a delay locked loop circuit, the circuit having a coarse phase adjust circuit, a fine phase adjust circuit, a first FIFO circuit, a second FIFO circuit and circuitry. Each FIFO stores a plurality of control signals. The circuitry measures a phase difference between an input clock signal and an output clock signal. Based on the measured phase difference, the circuitry adjusts a control signal for the coarse phase adjust circuit and a control signal for the fine phase adjust circuit. The circuitry inputs a first one of the adjusted signals into the first FIFO and inputs a second one of the adjusted signals into the second FIFO. The inputs occur on a first edge of the input clock signal. The first FIFO circuit outputs the first one of the adjusted signals on a second edge of the input clock signal and the second FIFO circuit outputs the second one of the adjusted control signals on the second edge of the input clock signal. The second clock edge is delayed before clocking the output of the second FIFO.

Another embodiment of the invention provides a delay locked loop circuit having a means for delaying, means for making coarse phase adjustments, means for making fine phase adjustments, first means for storing, second means for storing, and means for controlling. The means for delaying provides a delay. The means for making coarse phase adjustments makes coarse phase adjustments to the phase of a clock signal based on a coarse phase adjustment setting. The means for making fine phase adjustments makes fine phase adjustments to the phase of a clock signal based on a fine phase adjustment setting. The first means for storing and second means for storing store a plurality of control signals. The means for controlling measures a phase difference between an input clock signal and an output clock signal. Based on the first measured phase difference, the means for controlling stores a first coarse phase adjustment setting in the first means for storing and stores a first fine phase adjustment setting in the second means for storing. The means for controlling applies one of the first coarse phase adjustment setting and the first fine phase adjustment setting to the input clock signal and applies the other of the first coarse phase adjustment setting and the first fine phase adjustment setting to a delayed clock signal. The delayed clock signal is the input clock signal delayed by the means for delaying.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide improved techniques and circuit configurations for a delay-locked loop (DLL) circuit. In one embodiment, a method for synchronizing control signals in a delay locked loop circuit is provided. The delay locked loop circuit has a coarse phase adjust circuit and a fine phase adjust circuit. The method includes measuring a first phase difference between an input clock signal and an output clock signal and based on the first phase difference, storing a first phase adjustment setting in a first FIFO and storing a second phase adjustment setting in a second FIFO. Each FIFO stores a plurality of settings. The first phase adjustment setting is applied to adjust a phase of the input clock signal and the adjusted clock signal passes through one or more delay elements, delaying the adjusted input clock signal. The second phase adjustment setting is applied to further adjust the delayed input clock signal. As a result, the first phase adjustment setting and the second phase adjustment setting are applied correctly with respect to an edge of the clock signal passing through the DLL circuit.

The techniques and circuit configurations described herein may be utilized in a wide variety of applications to adjust the phase of a generated signal. However, to facilitate understanding, the following description will refer to embodiments utilizing the techniques and circuit configurations in a DLL circuit of a dynamic random access memory (DRAM) as a particular, but not limiting application example.

A DLL Circuit Utilizing a Blender and Coarse Adjust FIFO

Figure 1:
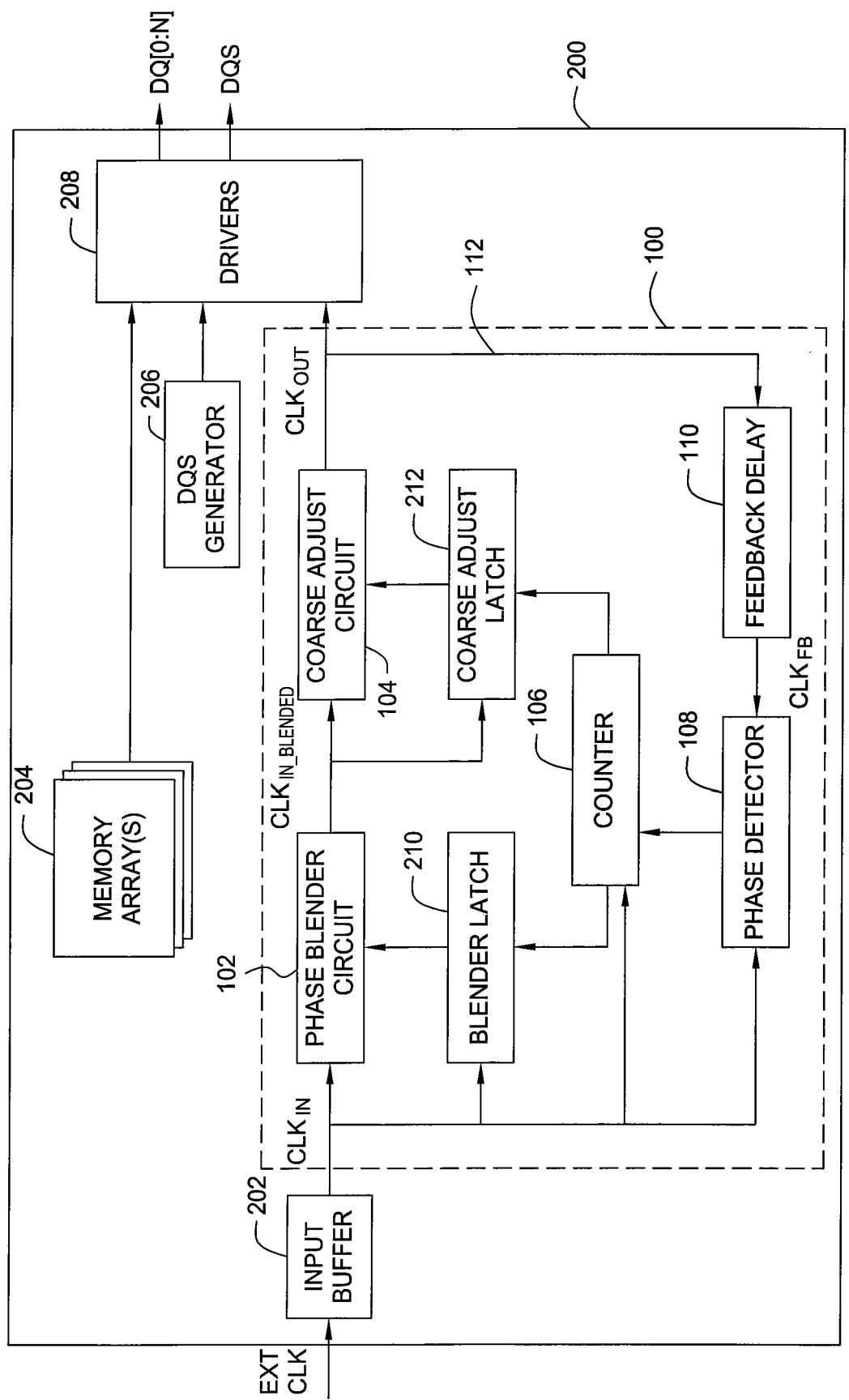
FIG. 1 is a block diagram of an exemplary DRAM device which utilizes a DLL circuit.
Figure 2:
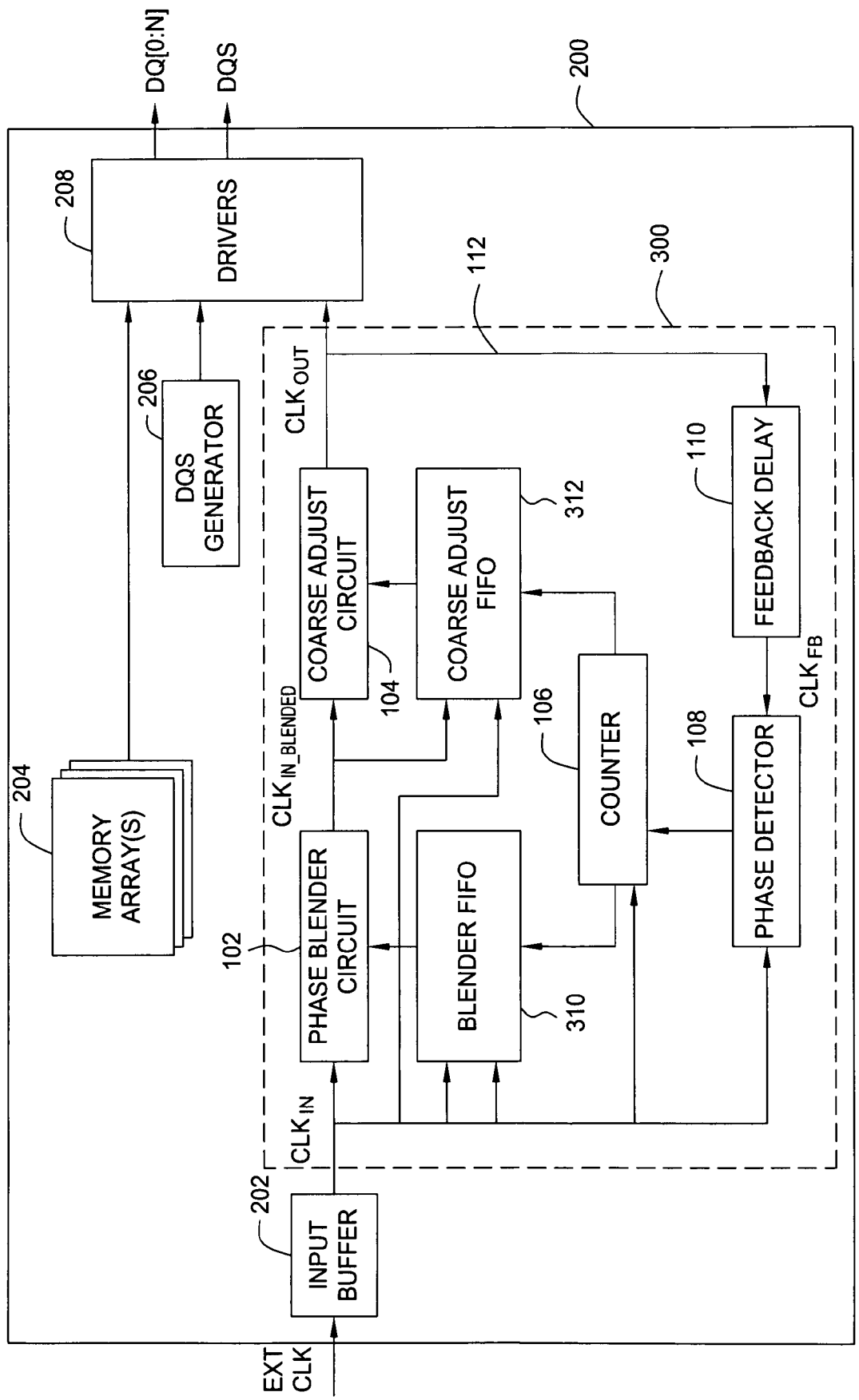
FIG. 2 is a block diagram depicting a DLL circuit having a blender and coarse adjust first-in, first out circuit (FIFO) according to one embodiment of the invention.

According to one embodiment of the invention, the DLL circuit 100 may be modified to avoid erroneous phase adjustments by inserting first-in, first-out circuits (FIFOs) for storing the coarse adjust and fine adjust settings. FIG. 2 is a block diagram depicting a DLL circuit 300 having a blender FIFO 310 and coarse adjust FIFO 312 according to one embodiment of the invention.

As illustrated, the DLL circuit 100 includes a phase blender circuit 102, a coarse adjust circuit 104, a counter 106, and a phase detector 108. In some cases, the DLL circuit 100 may also have other circuitry, such as control circuitry (described below) for synchronizing the clock signals. In some cases, such control circuitry may be integrated within other circuitry in the DLL 100, such as the counter 106, the phase blender circuit 102, or the coarse adjust circuit 104.

As described above, the $CLK_{IN}$ signal may pass through the phase blender circuit 102 (also referred to as the fine adjust circuit) and the coarse adjust circuit 104 before being output as a $CLK_{OUT}$ signal. The $CLK_{OUT}$ signal may be fed back to the phase detector 108 through the feedback delay 110. The phase detector 108 may compare the phase of $CLK_{FB}$ to $CLK_{IN}$ and generate a signal to the counter 106 which may output control signals which may be used to align the phases of $CLK_{IN}$ and $CLK_{FB}$. The counter 106 may adjust both of the control signals based on a phase difference (skew) detected by the phase detector 108.

Operation of the Blender and Coarse Adjust FIFO

According to one embodiment of the invention, the control signals output by the counter 106 may be output to a blender FIFO 310 and a coarse adjust FIFO 312. FIFOs are circuits which are capable of storing multiple data items wherein data items may be input to the FIFO using a first clock signal and output by the FIFO using a second clock signal (described below with respect to FIG. 3). By storing the coarse adjust and fine adjust settings in FIFOs, the settings may be synchronously applied to the coarse adjust circuit 104 and phase blender circuit 102 with respect to a given edge of the $CLK_{IN}$ signal. Thus, erroneous adjustments to the phase of the $CLK_{IN}$ signal may be avoided without the need for alternative solutions which may result in high complexity, large layout sizes, high power consumption, or frequency limits of the DLL circuit 100.

The input to the blender FIFO 310 may be the fine adjust control setting from the counter 106 and the input to the coarse adjust FIFO 312 may be the coarse adjust control setting from the counter 106. The output of the blender FIFO 310 may be used to control the phase blender circuit 102 and the output of the coarse adjust FIFO 312 may be used to control the coarse adjust circuit 104.

According to one embodiment of the invention, the $CLK_{IN}$ signal may be used to input data into the blender FIFO 310 from the counter 106 and out of the blender FIFO 310 to the phase blender circuit 102. The $CLK_{IN}$ signal may also be used to input data into the coarse adjust FIFO 312 from the counter 106. In one embodiment, the delayed version of $CLK_{IN}$ output by the phase blender circuit 102 ($CLK_{IN\_BLENDED}$) may be applied to the output of the coarse adjust FIFO 312 to output data to the coarse adjust circuit 104. Operation of a FIFO and the DLL circuit 300 are now described with respect to FIGS. 3-5.

Figure 3:
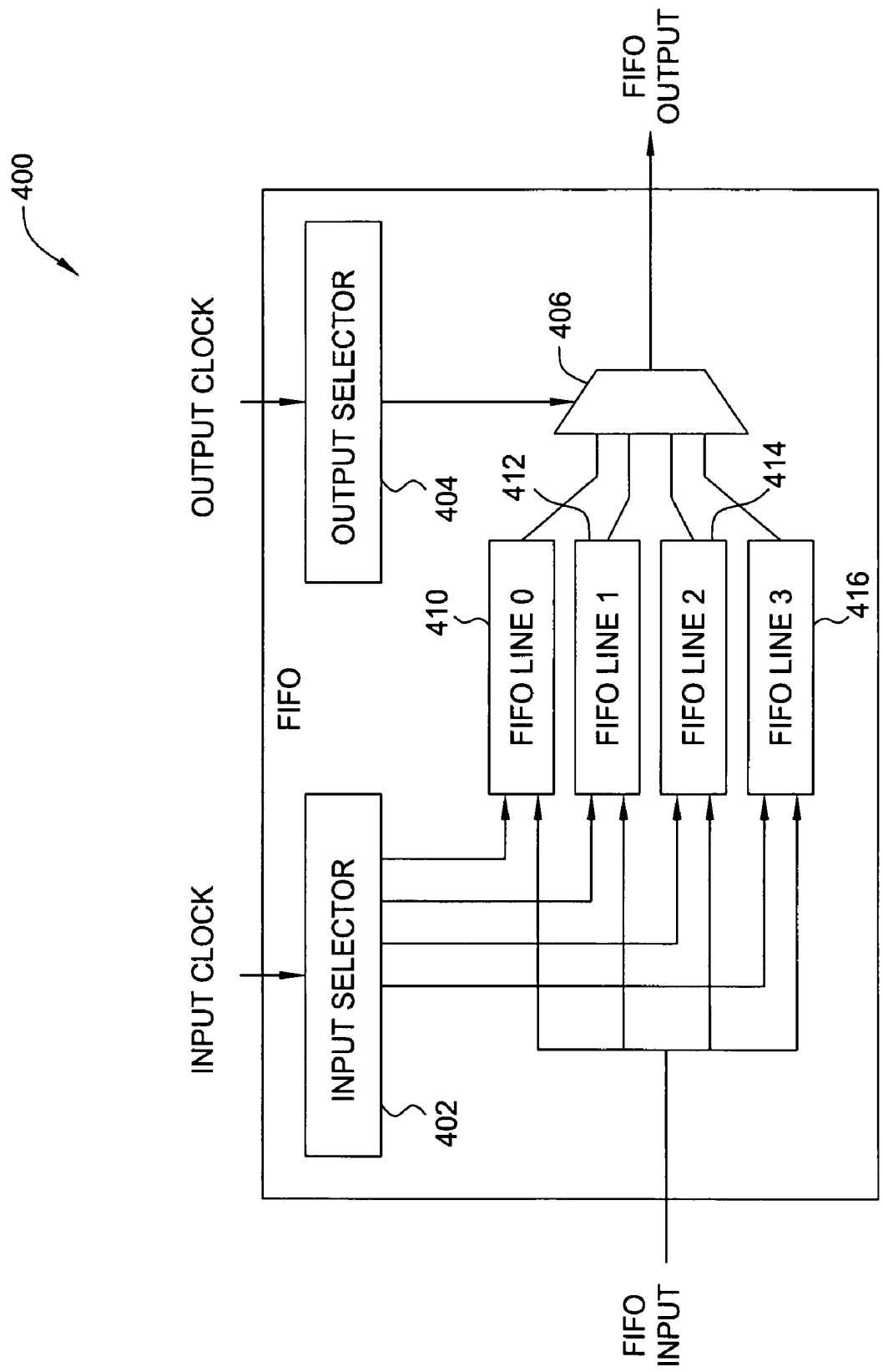
FIG. 3 is a block diagram depicting a FIFO according to one embodiment of the invention.

FIG. 3 is a block diagram depicting an exemplary FIFO circuit 400. As previously stated, the FIFO circuit 400 is capable of storing multiple data items. Each of the data items may be stored in a separate FIFO line 410, 412, 414, 416.

A first clock signal (referred to as an input clock) may be used to input data items into the FIFO 400. As data items are input into the FIFO 400, each new data item fills a line in the FIFO 400. For instance, the first item input into the FIFO may be placed into FIFO line 0 410, the second into FIFO line 1 412, and so on. An input selector 402 may keep track of where each incoming data item is to be inserted. If the FIFO 400 fills up (e.g., FIFO lines 0-3 410, 412, 414, 416 contain data), the input selector 402 may continue inputting data in the next available line, overwriting any data that was previously in that line.

For instance, if the last data item was written into an empty slot in FIFO line 3 416, the input selector 402 may place the next incoming data item into FIFO Line 0 (wrapping from Line 3 416 to Line 0 410), thus overwriting (and effectively erasing) any data previously stored in FIFO Line 0 410. Thus, if data are input into the FIFO 400 more frequently than data are output from the FIFO 400, in some cases the FIFO 400 may overflow and lose data previously stored therein. Where the FIFO 400 overflows, an error condition may be created. Where an error condition is present, the FIFO 400 may respond to such an error condition in any manner known to those skilled in the art. For example, in some cases, the FIFO circuit 400 may prevent older data in the FIFO 400 from being overwritten when the FIFO 400 is full.

A second clock signal (referred to as an output clock) may be used to output data items from the FIFO 400. Each time the data is output from the FIFO 400, one of the FIFO lines 410, 412, 414, 416 may be selected by an output selector 404 using a multiplexer (MUX) 406.

The FIFO 400 is so-called ("first-in, first-out") because a first data item input into the FIFO 400 will be the first data item output from the FIFO 400. Thus, for example, if a first data item and then a second data item are input into the FIFO 400 and placed in FIFO line 0 410 and FIFO line 1 412 respectively, the next time data is output from the FIFO 400, the output selector 404 may select FIFO Line 0 410 to be output by the FIFO 400. If data is subsequently output from the FIFO 400, the output selector may select FIFO Line 1 412 to be output by the FIFO 400.

If data are output from the FIFO 400 more often than data are input into the FIFO 400, an error condition may develop wherein the FIFO 400 contains no data to be output. According to one embodiment, when the FIFO 400 contains no data to be output and a clock signal is applied to the output of the FIFO 400, the FIFO may output the data from the last line of the FIFO 400 which was output. Then, if more data are placed in the FIFO 400, that data may be output the next time a clock signal is applied to the output of the FIFO 400. Such an error condition in the FIFO 400 may also be handled in any other manner known to those skilled in the art.

The FIFO configuration depicted in FIG. 3 is merely a simplified example of the form a FIFO may take. In general, embodiments of the invention may be used to effect with any type of FIFO circuit, including any FIFO circuits known to those skilled in the art. 41 Operation of the DLL circuit 300 having a blender FIFO 310 and coarse adjust FIFO 312 is now described with respect to FIGS. 4-5.

Operation of a DLL Circuit Having Control Signal FIFOS

As previously mentioned, the blender FIFO 310 and coarse adjust FIFO 312 may be used to synchronize the control signals applied to the phase blender circuit 102 and coarse adjust circuit 104 with respect to a clock signal passing through the DLL circuit 300.

Figure 4:
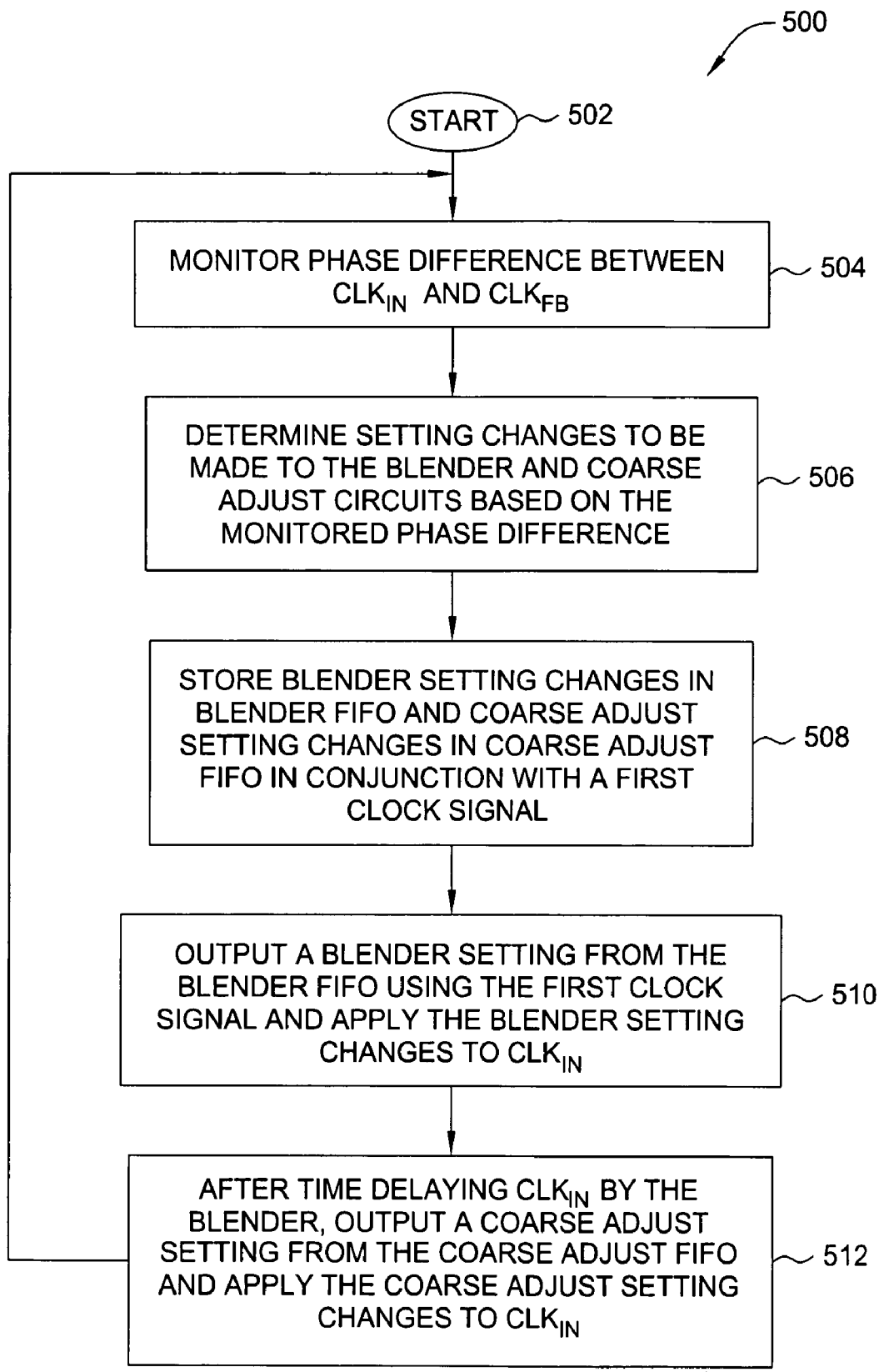
FIG. 4 is a flow diagram depicting a process for synchronizing input and output signals according to one embodiment of the invention.

FIG. 4 is a flow diagram depicting a process 500 for synchronizing coarse adjust and fine adjust control signals applied to a DLL circuit 300 according to one embodiment of the invention. The process 500 may begin at step 502 and continue to step 504 where a phase difference between $CLK_{IN}$ and $CLK_{FB}$ is monitored, for example, by the phase detector 108.

Based on the monitored phase difference, setting changes may be selected for the blender and coarse adjust circuits 102, 104 at step 506. According to one embodiment of the invention, the setting changes may be selected by the counter 106 and may be output in the form of a decimal number as described above.

In cases where a control circuit other than a counter is used to make control setting changes, the setting changes may be selected by that control circuit. Also, in some cases, setting changes may not be required, e.g., if previous setting changes corrected the phase difference between $CLK_{IN}$ and $CLK_{FB}$. Thus, according to one embodiment of the invention, the counter may issue the previous blender setting and coarse adjust setting such that no changes are made to the phase settings for the phase blender circuit 102 and coarse adjust circuit 104.

At step 508, the blender setting changes and the coarse adjust setting changes may be stored in the blender FIFO 310 and the coarse adjust FIFO 312 respectively in conjunction with a first clock signal. According to one embodiment of the invention, the setting changes may be stored by clocking the inputs of both FIFOs 310, 312 in conjunction with the $CLK_{IN}$ signal. When the setting changes are input into the FIFOs 310, 312 (for example, in conjunction with the $CLK_{IN}$ signal), the changes may be stored in FIFO lines 410, 412, 414, 416 as described with respect to FIG. 3. In some cases, a signal other than the $CLK_{IN}$ signal may be used to store the blender setting changes and the coarse adjust changes. For instance, in one embodiment, the counter 106 may assert a signal to the blender FIFO 310 and the coarse adjust FIFO 312, thereby causing each FIFO 310, 312 to store the blender setting changes and coarse adjust setting changes.

At step 510, a setting stored in the blender FIFO 310 may be output and to the phase blender circuit 102. According to one embodiment of the invention, the blender setting change may be output by the blender FIFO 310 as a number and decoded by the phase blender circuit 102. The phase blender circuit 102 may then make adjustments to the phase of $CLK_{IN}$ based on the newly output blender setting.

At step 512, after time delaying the adjusted $CLK_{IN}$ signal, the coarse adjust FIFO 312 may output a coarse adjust setting to the coarse adjust circuit 104. According to one embodiment of the invention, the settings stored in the coarse adjust FIFO 104 may be output in conjunction with the delayed $CLK_{IN}$ signal. In some cases, the coarse adjust setting change may be output by the coarse adjust FIFO 312 as a number and decoded by the coarse adjust circuit 104. The coarse adjust circuit 104 may then make adjustments to the phase of the delayed $CLK_{IN}$ signal based on the newly output coarse adjust setting.

Thus, for a given edge of the $CLK_{IN}$ signal (or for any value of the $CLK_{IN}$ signal at a given point in time), the corresponding blender setting changes and coarse adjust setting changes issued by the counter 106 may be applied synchronously to the $CLK_{IN}$ signal despite the fact that the $CLK_{IN}$ signal is time delayed between the time that the blender setting change is applied and the time that the coarse adjust setting change is applied. In other words, as the $CLK_{IN}$ signal travels through the DLL circuit 300, the blender setting change may be applied to adjust the $CLK_{IN}$ signal first, the adjusted $CLK_{IN}$ signal may be delayed, and then the coarse adjust setting change may be applied to the adjusted-delayed $CLK_{IN}$ signal. By storing the coarse adjust setting change in the coarse adjust FIFO 312 until the time-delayed $CLK_{IN}$ signal arrives at the coarse adjust circuit 104, the coarse adjust setting change may be applied to the $CLK_{IN}$ signal which has been adjusted by the corresponding blender setting change issued by the counter 106.

After the coarse adjust setting has been applied to the time-delayed $CLK_{IN}$ signal, the process 500 may continue at step 504 where the phase difference (if any) between $CLK_{IN}$ and $CLK_{FB}$ continues to be monitored.

Figure 5:
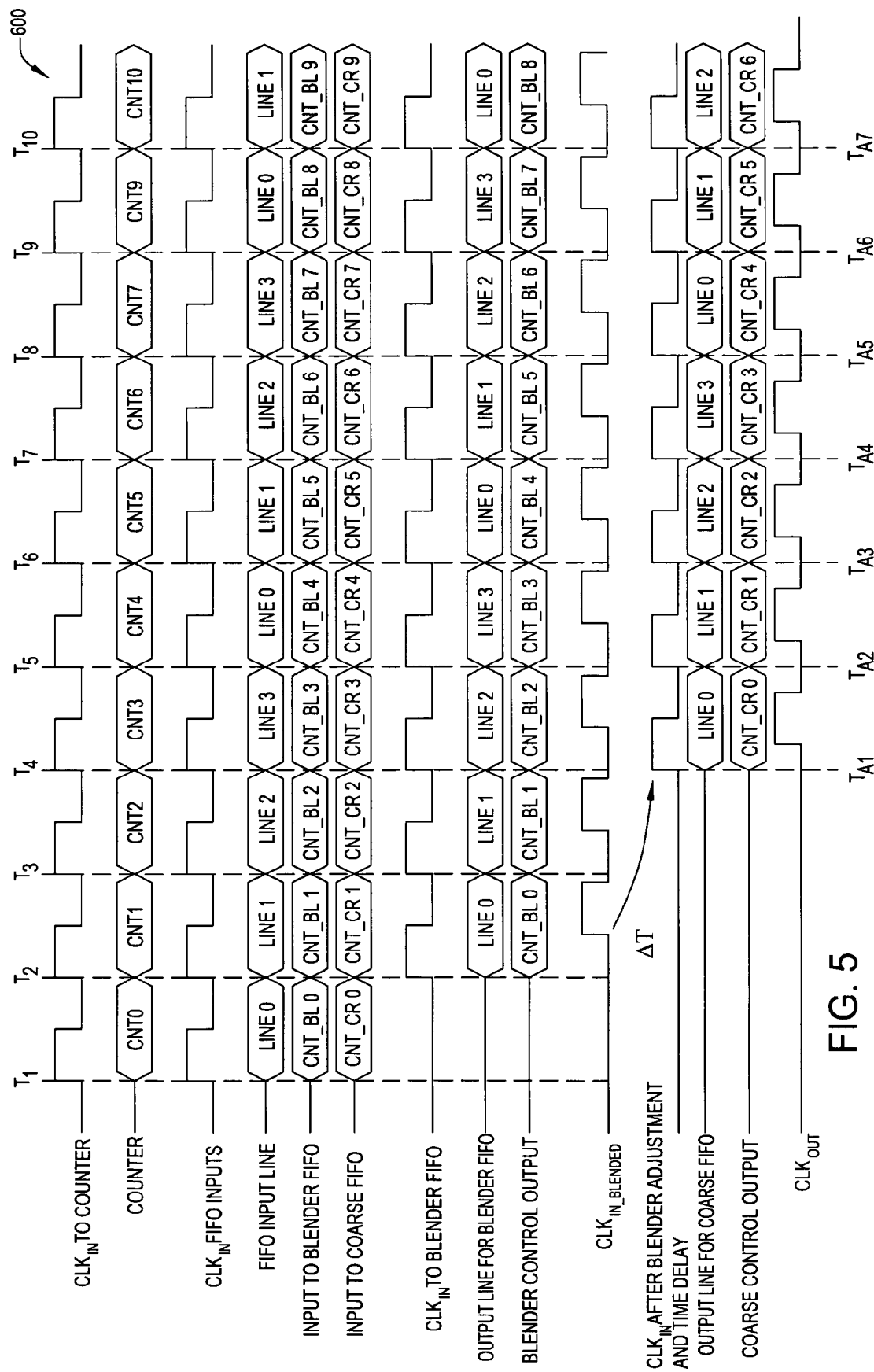
FIG. 5 is a timing diagram depicting control signals for controlling a DLL according to one embodiment of the invention.

FIG. 5 is a timing diagram 600 depicting blender control settings and coarse adjust control settings which are placed in a blender FIFO 310 and coarse adjust FIFO 312 according to one embodiment of the invention.

The timing diagram begins at time $T_1$ which may be, for example, after the memory device 200 is powered on, or after a reset command is issued to the memory device 200.

At time $T_1$, the $CLK_{IN}$ signal may be used to output a count (CNT 0) comprising blender and coarse adjust control settings (CNT_BL 0 and CNT_CR 0, respectively) from the counter 106. Also at time $T_1$, the blender and coarse adjust control settings may be input into the blender FIFO 310 and the coarse adjust FIFO 312 in conjunction with the $CLK_{IN}$ signal. The phase blender and coarse adjust control settings may be placed into line 0 of the respective blender FIFO 310 and coarse adjust FIFO 312.

Also at time $T_1$, a clock signal may not be applied to the outputs of the blender FIFO 310 and coarse adjust FIFO 312 because the FIFOs 310, 312 may have no control settings to output. Thus, according to one embodiment, no control settings may be applied to the phase blender circuit 102 or the coarse adjust circuit 104. According to one embodiment of the invention, control circuitry in the DLL circuit 300 may be used to prevent a clock signal from being applied to the outputs of the blender FIFO 310 and coarse adjust FIFO 312. Optionally, in another embodiment of the invention, default settings may be applied to the phase blender circuit 102 and coarse adjust circuit 104.

At time $T_2$, a next rising edge of $CLK_{IN}$ may cause the counter 106 to output another count CNT 1 comprising a phase blender setting CNT_BL 1 and a coarse adjust setting CNT_CR 1. These control settings may be placed in line 1 of the blender FIFO 310 and coarse adjust FIFO 312 respectively.

Also at time $T_2$, CNT_BL 0 may be output from the blender FIFO 310 to the phase blender circuit 102 which may apply the CNT_BL 0 setting (which was input into the FIFO 310 at time $T_1$) to the $CLK_{IN}$ signal, thereby making adjustments to the $CLK_{IN}$ phase (depicted as "$CLK_{IN}$ after blender adjustment").

At time $T_3$, a next rising edge of $CLK_{IN}$ may cause the counter 106 to output another count CNT 2 comprising a phase blender setting CNT_BL 2 and a coarse adjust setting CNT_CR 2. These control settings may be placed in line 2 of the blender FIFO 310 and coarse adjust FIFO 312. Also at time $T_3$, the CNT_BL 1 signal may be output from the blender FIFO 310 to the phase blender circuit 102 in conjunction with the $CLK_{IN}$ signal. The phase blender circuit may then apply the CNT_BL 1 setting (which was input into the FIFO 310 at time $T_2$) to the $CLK_{IN}$ signal.

At time $T_4$, a next rising edge of $CLK_{IN}$ may cause the counter 106 to output yet another count CNT 3 comprising a phase blender setting CNT_BL 3 and a coarse adjust setting CNT_CR 3. These control settings may be placed in line 3 of the blender FIFO 310 and coarse adjust FIFO 312. The CNT_BL 2 setting may also be output from blender FIFO 310 in conjunction with the $CLK_{IN}$ signal. The phase blender circuit 102 may then apply the CNT_BL 2 setting (which was input into the FIFO 310 at time $T_3$) to the $CLK_{IN}$ signal.

Illustratively, between times $T_2$ and $T_4$, the $CLK_{IN}$ signal adjusted by the blender circuit 102 ($CLK_{IN\_BLENDED}$) may be delayed for time $\Delta T$ by the DLL circuit 300. Thus, the $CLK_{IN}$ signal which was adjusted by phase blender setting CNT_BL 0 may not arrive at the coarse adjust circuit 104 until time $T_{A1}$. Thus, at time $T_{A1}$, the coarse adjust setting CNT_CR 0 may be output by the coarse adjust FIFO 312 in conjunction with the adjusted-delayed $CLK_{IN}$ signal. The coarse adjust circuit 104 may then apply the CNT_CR 0 setting to the same portion of the $CLK_{IN}$ signal affected by the corresponding phase blender setting CNT_BL 0. The result of applying the coarse adjust setting CNT_CR 0 to the adjusted and delayed $CLK_{IN}$ signal is labeled as $CLK_{OUT}$.

Continuing at times $T_{A2}$, $T_{A3}$, etc., the coarse adjust settings CNT_CR 1 and CNT_CR 2 may be output from the coarse adjust FIFO 312 and the coarse adjust circuit may apply the setting changes respectively to the $CLK_{IN}$ signal modified by the blender settings CNT_CR 1 and CNT_CR 2 respectively. Thus, corresponding pairs of control signals issued by the counter 106 may be applied correctly with respect to the $CLK_{IN}$ signal as it travels through the DLL circuit 300 and is output as the $CLK_{OUT}$ signal.

Again at time $T_5$, a next rising edge of $CLK_{IN}$ may cause the counter 106 to output yet another count CNT 4 comprising a phase blender setting CNT_BL 4 and a coarse adjust setting CNT_CR 4. At times $T_1$ through $T_4$, lines 0 to 3 of each of the FIFOs 310, 312 may have already been filled. Accordingly, the settings CNT_BL 4 and CNT_CR 4 may be placed in line 0 of the blender and coarse adjust FIFOs 310, 312. However, because the contents of line 0 of each of the FIFOs 310, 312 were already been output (CNT_BL 0 was output from line 0 of the blender FIFO 310 at time $T_2$ and CNT_CR 0 was output from line 0 of the coarse adjust FIFO 312 at time $T_{A1}$), no data stored in either FIFO 310, 312 is overwritten when the input line wraps back around to line 0 of each of the FIFOs 310, 312. Accordingly, no error conditions are created in either of the FIFOs 310, 312.

Also at time $T_5$, the CNT_BL setting may be output by the blender FIFO 310 and the phase blender circuit may apply the CNT_BL 3 setting (which was input into the FIFO 310 at time $T_4$) to the $CLK_{IN}$ signal.

The process of inputting data into the FIFOs 310, 312 may continue at times $T_6$ through $T_{10}$. Also at times $T_6$ through $T_{10}$, the process of clocking the output of the blender FIFO 310 and applying the phase blender setting changes (CNT_BL 4 through CNT_BL 8) to $CLK_{IN}$ may be continued. Similarly, at times $T_{A2}$ through $T_{A7}$ (and continuing) the process of outputting data from the coarse adjust FIFO 312 and applying the coarse adjust setting changes CNT_CR 1 through CNT_CR 6 to the $CLK_{IN}$ signal as delayed and adjusted by phase blender settings CNT_BL 1 through CNT_BL 6 may be continued, thus applying corresponding fine and coarse phase adjustments synchronously with respect to a given edge of the $CLK_{IN}$ signal passing through the DLL circuit stages.

While some signals and events in FIG. 5 are depicted and described above as occurring simultaneously, those skilled in the art will recognize that certain events depicted may be offset in time to ensure correct functionality of the DLL circuit 300. For example, the $CLK_{IN}$ signals applied to the phase blender circuit 102, blender FIFO 310 inputs and outputs, coarse adjust FIFO input 312, counter 106, and phase detector 108 may in some cases be offset with respect to one another, for example, to satisfy setup and hold times required by the various circuits or to prevent errors which may be caused by delays in signal propagation.

Similarly, the tap points (places from which a signal is drawn) used to supply the clock signals $CLK_{IN}$ and $CLK_{OUT}$ to various circuits within the DLL 300 circuit may be placed at varying points in the DLL circuit 300 in order to provide different clock signals to the various circuits of the DLL 300.

In some cases, synchronization and initialization of signals may be required when the DLL circuit 300 is originally powered on, reset, or during any other period wherein control settings stored in the blender FIFO 310 and coarse adjust FIFO 312 are interrupted. Any synchronization and initialization of signals may be achieved using any method known to those skilled in the art. For example, according to one embodiment, when the DLL circuit 300 is powered on or reset, a reset signal may be applied to the blender FIFO 310 and coarse adjust FIFO 312, causing each FIFO 310, 312 to be filled with default control setting to be applied to the phase blender circuit 102 and coarse adjust circuit 104.

In one embodiment, after a reset signal is applied to the DLL circuit 300, the outputs of each of the FIFOs 310, 312 may be changed to a high-impedance state until control settings selected by the counter 106 are input to the FIFOs 310, 312. While the outputs of the FIFOs 310, 312 are in a high-impedance state, the phase blender circuit 102 and the coarse adjust circuit 104 may assume some default setting or behavior in adjusting the $CLK_{IN}$ signal.

In yet another embodiment of the invention, no initialization may be utilized by the DLL circuit 300.

While the blender and coarse adjust FIFOs 310, 312 are depicted as having four FIFO lines 410, 412, 414, 416, it is contemplated that the blender and coarse adjust FIFOs 3120, 312 may have more or less lines than depicted in the exemplary FIFO 400 of FIG. 3. In addition, according to one embodiment, each of the FIFOs 310, 312 may have a different number of lines. In general, to prevent data loss in the FIFOs 310, 312 (e.g., the coarse adjust FIFO 312), the depth of the FIFO (e.g., number of lines) times a number of clock cycles applied to the output of the FIFO should be greater than the amount by which the clock signal (e.g., $CLK_{IN}$) is delayed. By setting the FIFO depth in this manner, error conditions in the FIFO may be avoided in some cases.

For example, with respect to FIG. 5, the $CLK_{IN}$ signal is delayed by approximately three clock cycles before it reaches the coarse adjust circuit 104. Accordingly, the appropriate depth for the coarse adjust FIFO 312 is four lines, because just after the first FIFO line (line 0) 410 is output to the coarse adjust FIFO 312, the first line will be overwritten on the next clock cycle by another coarse adjust setting. However, according to another embodiment of the invention, the signals in the DLL circuit 300 may be delayed in a manner such that the above depth calculation for each FIFO 310, 312 is not used. Accordingly, each FIFO 310, 312 may have depths which are greater than or less than the above-stated calculation. In such cases, appropriate FIFO depths should be readily ascertainable by those skilled in the art depending on the configuration selected for the DLL circuit 300.

According to one embodiment of the invention, any type of control signal issued to the coarse adjust circuit 104 and phase blender circuit 102 may be stored in the coarse adjust FIFO 312 and blender FIFO 310. For example, according to one embodiment of the invention, when making coarse adjustments to the $CLK_{IN}$ signal, the coarse adjust circuit 104 may use a shift register design to select a number of delay elements in a delay line instead of a using a decoder to decode a count output by the counter 106. Thus, controls issued to the coarse adjust circuit 104 may be in the form of a shift left and shift right signal. Where shift left and shift right signals are issued to the coarse adjust circuit 104, such signals may also be stored in a coarse adjust FIFO 312. Similarly, any other type of control signal issued to either the phase blender circuit 102, the coarse adjust circuit 104, or to any other control circuit within the DLL circuit 300 may be stored within a FIFO.

As another example, while described above as being decimal numbers (e.g., 10.9, 11.0, etc.), the control signals output by the counter 106 may be in any format. For example, according to one embodiment of the invention, the control signals output by the counter may be a whole number (e.g., 59, 60, etc.) wherein the first digit (5, 6) is a coarse adjust setting and the second digit (9, 0) is a fine adjust setting. Furthermore, as known to those skilled in the art, the control settings output by the counter 106 may be output as a multi-bit binary number wherein one or more bits of the binary number forms the coarse adjust setting and wherein one or more bits of the binary number forms the fine adjust setting.

In one embodiment of the invention, the order of the phase blender circuit 102 and coarse adjust circuit 104 may be reversed. Thus, the $CLK_{IN}$ signal may pass through the coarse adjust circuit 104 before passing through the blender circuit 102. Where the $CLK_{IN}$ signal passes through the coarse adjust circuit 104 before passing through the blender circuit 102, a blender FIFO 310 and a coarse adjust FIFO 312 may also be used to apply control signals from the counter 106 to the phase blender circuit 102 and coarse adjust circuit 104. The control signals may be applied in an order corresponding to the order of the coarse adjust circuit 104 and phase blender circuit 102.

While described above with respect to a single phase blender circuit 102 and coarse adjust circuit 104 controlled by a blender FIFO 310 and a coarse adjust FIFO 312, embodiments of the invention may also be adopted for use with circuits which employ latches, parallel delay elements, multiple blender delay lines, and/or mimic delays. Also, as previously mentioned, FIFOs may be utilized with any of the control signals utilized to adjust the phase of a clock signal in a given configuration of a DLL circuit.

Furthermore, while the foregoing is directed to embodiments of the present invention, other and further embodiments of the invention may be devised without departing from the basic scope thereof, and the scope thereof is determined by the claims that follow.

What is claimed is:

1. A method for synchronizing control signals in a delay locked loop circuit, the delay locked loop circuit comprising a coarse phase adjust circuit and a fine phase adjust circuit, the method comprising:
    measuring a first phase difference between an input clock signal and an output clock signal;
    based on the first phase difference, storing a first phase adjustment setting in a first first-in, first-out circuit (FIFO) and storing a second phase adjustment setting in a second FIFO, wherein each FIFO stores a plurality of settings;
    outputting the first phase adjustment setting from the first FIFO to adjust a phase of the input clock signal;
    delaying the adjusted input clock signal, wherein the adjusted clock signal passes through one or more delay elements; and
    outputting the second phase adjustment setting from the second FIFO to further adjust the delayed input clock signal, thereby generating the output clock signal.

2. The method of claim 1, wherein a setting stored in the first FIFO is output in conjunction with the input clock signal and wherein a setting stored in the second FIFO is output in conjunction with the delayed clock signal.

3. The method of claim 2, wherein the first phase adjustment setting is input into the first FIFO and the second phase adjustment setting is input into the second FIFO in conjunction with the input clock signal.

4. The method of claim 1, wherein the delayed clock signal is delayed by a number of clock cycles, and wherein a depth of the second FIFO is greater than the number of clock cycles.

5. The method of claim 1, wherein the first phase adjustment setting is a coarse phase adjustment setting applied to the coarse phase adjust circuit and wherein the second phase adjustment setting is a fine phase adjustment setting applied to the fine phase adjust circuit.

6. The method of claim 1, wherein the second phase adjustment setting is a coarse phase adjustment setting applied to the coarse phase adjust circuit and wherein the first phase adjustment setting is a fine phase adjustment setting applied to the fine phase adjust circuit.

7. A method for synchronizing control settings in a delay locked loop circuit, the delay locked loop circuit comprising a coarse phase adjust circuit and a fine phase adjust circuit, the method comprising:
  measuring a first phase difference between an input clock signal and an output clock signal;
  based on the first measured phase difference, storing one or more coarse adjust control settings in a coarse adjust FIFO and storing one or more fine adjust control settings in a fine adjust FIFO, wherein each FIFO stores a plurality of control settings, and wherein the input clock signal is used to clock an input of each FIFO;
  outputting a setting from a first one of the FIFOs in conjunction with the input clock signal;
  outputting a setting from a second one of the FIFOs in conjunction with a time-delayed version of the input clock signal;
  applying the setting output from the coarse adjust FIFO and the setting output from the fine adjust FIFO to the coarse phase adjust circuit and the fine phase adjust circuit respectively, wherein the one or more coarse adjust settings in the coarse adjust FIFO and the one or more fine adjust control settings in the fine adjust FIFO are applied to an edge of the input clock signal in the delay locked loop circuit passing through the coarse phase adjust circuit and the fine phase adjust circuit.

8. The method of claim 7, wherein the time delayed version of the input clock signal passes through a delay circuit having one or more delay elements.

9. The method of claim 7, wherein the first one of the FIFOs is the coarse adjust FIFO, wherein the second one of the FIFOs is the fine adjust FIFO, and wherein the one or more coarse adjust control signals modify the input clock signal, and wherein the modified input clock signal is the time-delayed version of the input clock signal.

10. The method of claim 9, wherein the one or more fine adjust control signals adjust modify the time-delayed version of the input clock signal, and wherein the modified version of the input clock signal is the output clock signal.

11. The method of claim 10, wherein the first one of the FIFOs is the fine adjust FIFO, wherein the second one of the FIFOs is the coarse adjust FIFO, and wherein the one or more fine adjust control signals modify the input clock signal, and wherein the modified input clock signal is the time-delayed version of the input clock signal.

12. A delay locked loop circuit, the circuit comprising:
  a fine phase adjust circuit configured to make fine phase adjustments to the phase of a clock signal based on a fine phase adjustment setting;
  a coarse phase adjust circuit configured to make coarse phase adjustments to the phase of a second clock signal based on a coarse phase adjustment setting, wherein the second clock signal is an output signal of the fine phase adjust circuit; and circuitry configured to:
  measure a phase difference between an input clock signal and an output clock signal, wherein the output clock signal is an output signal of the course phase adjustment circuit:
  based on the first measured phase difference, store a first coarse phase adjustment setting in a first FIFO circuit and store a first fine phase adjustment setting in a second FIFO;
  apply one of the first coarse phase adjustment setting and the first fine phase adjustment setting to the input clock signal; and apply whichever of the first coarse phase adjustment setting and the first fine phase adjustment setting, not applied to the input clock signal to a delayed clock signal, thereby generating the output clock signal, wherein the delayed clock signal is the input clock signal delayed, wherein the delay is a number of clock cycles, and wherein a depth of the second FIFO is greater than the number of clock cycles.

13. A delay locked loop circuit, the circuit comprising:
  a coarse phase adjust circuit;
  a fine phase adjust circuit;
  a first FIFO circuit and a second FIFO circuit, wherein each FIFO stores a plurality of control signals;
  circuitry configured to:
    measure a phase difference between an input clock signal and an output clock signal;
    based on the measured phase difference, adjust a control signal for the coarse phase adjust circuit and a control signal for the fine phase adjust circuit; and
    input a first one of the adjusted signals into the first FIFO and input a second one of the adjusted signals into the second FIFO, wherein the inputs occur on a first edge of the input clock signal, wherein the first FIFO circuit outputs the first one of the adjusted signals on a second edge of the input clock signal, and wherein the second FIFO circuit outputs the second one of the adjusted control signals on the second edge of the input clock signal, wherein the second clock edge is delayed before clocking the output of the second FIFO.

14. The delay locked loop circuit of claim 13, wherein the second clock edge is delayed by a number of clock cycles before clocking the output of the second FIFO, and wherein a depth of the second FIFO is greater than the number of clock cycles.

15. The delay locked loop circuit of claim 13, wherein the depth of the second FIFO corresponds to a number of data lines in the FIFO, wherein each data line holds one of a plurality of adjusted control signals.

16. The delay locked loop circuit of claim 13, wherein the first FIFO is a fine adjust FIFO, wherein the second FIFO is a coarse adjust FIFO, and wherein the control signal for the fine adjust circuit is applied to the fine adjust circuit to modify the input clock signal, and wherein the modified input clock signal is the time-delayed version of the input clock signal.

17. The delay locked loop circuit of claim 13, wherein the first FIFO is a coarse adjust FIFO, wherein the second FIFO is a fine adjust FIFO, and wherein the control signal for the coarse adjust circuit is applied to the coarse adjust circuit to modify the input clock signal, and wherein the modified input clock signal is the time-delayed version of the input clock signal.

18. A delay locked loop circuit, the circuit comprising:
  means for making fine phase adjustments configured to make fine phase adjustments to the phase of a clock signal based on a fine phase adjustment setting;
  means for making coarse phase adjustments configured to make coarse phase adjustments to the phase of a second clock signal based on a coarse phase adjustment setting, wherein the second clock signal is an output signal of the fine phase adjust circuit;

first means for storing and second means for storing, wherein each means for storing stores a plurality of control signals;

means for controlling configured to:
  measure a phase difference between an input clock signal and an output clock signal, wherein the output clock signal is an output signal of the course phase adjust circuit;
  based on the first measured phase difference, store a first coarse phase adjustment setting in the first means for storing and storing a first fine phase adjustment setting in the second means for storing;
  apply one of the first coarse phase adjustment setting and the first fine phase adjustment setting to the input clock signal; and
  apply the other of the first coarse phase adjustment setting and the first fine phase adjustment setting to a delayed clock signal, thereby generating the output clock signal, wherein the delayed clock signal is the input clock signal delayed.

19. The delay locked loop circuit of claim 18, wherein first data are output from the first means for storing in conjunction with the input clock signal and wherein second data are output from second means for storing in conjunction with the delayed clock signal.

20. The delay locked loop circuit of claim 19, wherein a first setting is input into the first means for storing and a second setting is input into the second means for storing in conjunction with the input clock signal.

21. The delay locked loop circuit of claim 19, wherein the delay is a number of clock cycles, and wherein a depth of the second means for storing is greater than the number of clock cycles.

\* \* \* \* \*

UNITED STATES PATENT AND TRADEMARK OFFICE
CERTIFICATE OF CORRECTION

| | | |
|---|---|---|
| PATENT NO. | : 7,292,080 B2 | Page 1 of 1 |
| APPLICATION NO. | : 11/211825 | |
| DATED | : November 6, 2007 | |
| INVENTOR(S) | : Alessandro Minzoni | |

It is certified that error appears in the above-identified patent and that said Letters Patent is hereby corrected as shown below:

In the Claims Section:

In Claim 12, at Column 13, Line 52, please delete "adiust" and insert --adjust--; and at Column 13, Line 56, please delete "adiust circuit; and circuitry configured to:" and insert the following:

--adjust circuitry; and circuitry configured to:--.

Signed and Sealed this

Nineteenth Day of August, 2008

JON W. DUDAS
*Director of the United States Patent and Trademark Office*